United States Patent [19]
Hauge et al.

[11] Patent Number: 5,589,231
[45] Date of Patent: Dec. 31, 1996

[54] HALOGEN-ACTIVATED CHEMICAL VAPOR DEPOSITION OF DIAMOND

[75] Inventors: Robert H. Hauge, Houston, Tex.; Chenyu Pan, Tucson, Ariz.

[73] Assignee: Rice University, Houston, Tex.

[21] Appl. No.: 417,050

[22] Filed: Apr. 4, 1995

[51] Int. Cl.$^6$ ............................ B05D 3/06; B05D 3/14; C23C 16/26

[52] U.S. Cl. .................... 427/561; 427/562; 427/249; 427/122

[58] Field of Search .......................... 427/249, 255.1, 427/122, 561, 562; 423/446

[56] References Cited

U.S. PATENT DOCUMENTS 5,071,677  10/1991  Patterson et al. .................. 427/249
5,316,795   5/1994  Patterson et al. .................. 427/249

Primary Examiner—Roy V. King
Attorney, Agent, or Firm—Vinson & Elkins, L.L.P.

[57] ABSTRACT

The present invention is directed to a method of producing diamond films through the thermal dissociation of molecular chlorine into atomic chlorine in a heated graphite heat exchanger at temperatures of from about 1,100° C. to about 1,800° C. The atomic chlorine is subsequently rapidly mixed with molecular hydrogen and carbon-containing species downstream. Atomic hydrogen and the carbon precursors are produced through rapid hydrogen abstraction reactions of atomic chlorine with molecular hydrogen and hydrocarbons at the point where they mix. The mixed gases then flow across a heated substrate, where diamond is deposited as a film. Diamond deposits have been confirmed by Raman spectroscopy.

36 Claims, 2 Drawing Sheets

HALOGEN-ACTIVATED CHEMICAL VAPOR DEPOSITION OF DIAMOND

BACKGROUND OF THE INVENTION

1. Field of the Invention

This invention relates generally to a method for producing diamond by chemical vapor deposition.

2. Description of the Prior Art

Diamond has long been sought after not only for its intrinsic beauty and value as a gemstone but for its many unique and valuable mechanical, electrical, optical, and thermal properties. Diamond is the hardest material occurring in nature, has a low coefficient of friction, and is extremely resistant to chemical attack. It also is classified as a high bandgap semiconductor, is optically transparent to much of the electromagnetic spectrum, and has the highest heat conductivity of any material at room temperature. While, in fact, naturally occurring diamonds are far from scarce, humankind has long sought to produce these cystals synthetically.

The first such syntheses involved the application of high pressures and temperatures to bring about the allotropic transformation of graphite to diamond (for example, see U.S. Pat. No. 2,947,608). More recently, numerous studies have shown that diamond can be produced sythetically at low pressures using various fores of chemical vapor deposition (CVD) processes employing a gaseous carbon compound (for example, see U.S. Pat. Nos. 3,030,187, 4,767, 608, and 4,873,115).

In all of the CVD processes to date, with the exception of CVD growth on diamond single cystals where the growth is epitaxial for thin layers, the diamond produced takes the form of a thin polycrystalline film of extremely small diamond particles (typically less than 100 micrometers in diameter). In many of the processes, diamond is not formed by itself but rather in combination with graphite and diamond-like carbon (the latter species being a carbon allotrope with properties between those of graphite and diamond). The prior art processes for producing diamond all employ some high energy method of pretreating or activating one or more of the reactant species such as microwave or rf-generated plasmas (plasmas being the mixture of electrons and gaseous ions formed when the gases are heated to the range of 5,000° C. to 30,000° C.), or hot filaments, high temperature flames, arc discharges, electron beams, lasers, etc. (which heat the gases to a temperature of 2,000° C. to 3,000° C. or higher). All such high-temperature, high-energy steps comprise methods of pre-treatment of said gases to activate them to a "high energy level", by which is meant heating of the reactant gases to a temperature of 2,000° C. or higher. The activated gases then are impinged upon a substrate, with diamond growth occurring principally on the substrate surfaces directly in the path of the activated gases or plasma. Such processes are expensive because of the energy costs of activating the reactant gases and are relatively low-volume because of the difficulties of activating large volumes of gases. Also, they make it difficult to coat three dimensional or irregular objects with diamond film, because the objects must be turned to expose successive sides or areas to the flow from the activated gases.

All the CVD methods developed to date are physically-activated processes where atomic hydrogen, essential for diamond CVD, is first generated from the direct dissociation of molecular hydrogen. Because of the strong chemical bond in molecular hydrogen, the dissociation of molecular hydrogen requires very high activation gas temperatures and hence high activation energies. Currently, there are five major CVD diamond processes, namely, hot filament, combustion, microwave plasma, RF plasma, and plasma arc deposition. All of these processes involve gas temperatures greater than 2,000° C. in order to generate atomic hydrogen. The active carbon-containing species necessary for diamond CVD are generated either from the reactions of atomic hydrogen with the corresponding carbon-containing precursors, or from a direct activation by physical means such as plasmas and thermal heating. The activated gases then are impinged upon a substrate which, with the exception of diamond single crystals as substrates, is usually seeded with extremely small diamond particles by mechanical means such as rubbing and sonicating. Such processes depending on the particular process are expensive because of energy, materials, and capital costs of activating the reactant gases.

In hot filament CVD one has to consider the possible incorporation of the filament metal into diamond. Also in the hot filament and especially the plasma activation methods, one is likely to create active nitrogen species which are then responsible for nitrogen incorporation in diamond. Nitrogen impurities are known to affect electrical, thermal and optical properties of diamond.

Another major drawback to presently existing CVD processes is the requirement of high deposition or substrate temperatures (typically >700° C.). The growth of diamond at high substrate temperatures typically heightens the strain by thermal expansion differences between diamond and the substrate. The requirement of high substrate temperatures also excludes the direct coating of low temperature materials such as low melting ceramics, glasses and metals which do not withstand high temperature environments. Our invention eliminates many of these problems.

Most CVD processes also occur at pressures less than 100 Torr; those which do not, typically produce very impure diamond/graphite mixtures.

Many potential markets exist for diamond films and may involve the use of diamond coatings for extreme hardness, inertness to chemical attack, heat conductance, and other desirable properties. Some applications may further use doped diamond for its unique electrical properties. A major drawback to presently existing CVD diamond coating technologies is the difficulty of placing a diamond fill uniformly on objects with complex shapes. Another major problem exists with the high temperatures (typically >700° C.) usually required for diamond formation in existing CVD processes. Our invention eliminates many of these problems.

In U.S. Pat. No. 5, 071,677 there is described a method for depositing CVD diamond films and particles employing a halogen-assisted technique. While this technique is unique and solves many of the problems associated with CVD diamond deposition, it has been found that diamond deposition may be enhanced further by the addition of a chalcogen to the process of U.S. Pat. No. 5,071,677.

Chalcogens comprise the elements oxygen, sulfur, selenium, tellurium and polonium from group VI of the periodic table. As will be appreciated by those skilled in the art, a chalcogen (oxygen) may be present in minor amounts as an impurity in processes such as those disclosed in U.S. Pat. No. 5,071,677, either as a feedstock impurity or if elaborate steps are not taken to exclude and fully purge ambient air from the reactor, tubing, etc. Additionally, example 1 of the application used as a feedstock natural gas which contains minor amounts of oxygen as an impurity.

Subsequent to the filing of the application for U.S. Pat. No. 5,071,677, some researchers, attempting to duplicate the results there disclosed, have experienced difficulty in producing pure diamond films, if they took steps to exclude and purge all air from the reactor system. Other researchers, using similar oxygen-excluding measures, have reported no difficulty in duplicating applicant's results.

As a result of further study and experimentation, it was determined that the production of substantially pure diamond films, in accordance with the methods of U.S. Pat. No. 5,071,677, may be accomplished most reliably by the inclusion in the reactant gases of a minor amount of a chalcogen, most preferably oxygen or sulfur. The incorporation of a chalcogen into the process of U.S. Pat. No. 5,071,677, was the principal feature of Continuation-In-Part Application Ser. No. 07/696,769, now U.S. Pat. No. 5,316,795.

SUMMARY OF THE INVENTION

A further improvement of the halogen-assisted CVD of method in accordance with U.S. Pat. Nos. 5,071,677 and 5,316,795 is directed to a method of producing atomic hydrogen and the active carbon species necessary for diamond CVD. This method starts with the separate generation of atomic halogen, preferably atomic chlorine from the thermal dissociation of molecular chlorine in a heated graphite heat exchanger at temperatures of from about 1,100° C. to about 1,800° C. The atomic chlorine is subsequently rapidly mixed with molecular hydrogen and carbon-containing species downstream and preferably in close proximity (about 1 to 50 millimeters) from the substrate upon which diamond is to be deposited. Atomic hydrogen and the carbon precursors are produced through rapid hydrogen abstraction reactions of atomic chlorine with molecular hydrogen and hydrocarbons at the point where they mix. Due to the relatively short lives of the atomic hydrogen and active carbon species produced as the gases are mixed, it is important that the point of mixture of the atomic chlorine with the hydrogen and carbon-containing gas be in close proximity to the diamond growth substrate. The preferred distance will depend upon the temperatures, pressures and flow rates of the gases used, but preferably will be in the range of about 1 to 50 millimeters from the point of mixture to the substrate.

Diamond deposits have been confirmed by Raman spectroscopy. It has been found that the quality of diamond deposits varies, depending upon $H_2/Cl_2$ mole ratios and substrate temperatures. Generally, best quality diamond is produced at substrate temperatures less than about 950° C., with significant diamond depositions observed at temperatures down to 100° C. Preferably, the diamond growth substrate is maintained at a temperature at least 150° C. or more cooler than the activated halogen (chlorine) gas stream. Diamond growth rates of approximately 4 micrometers per hour have been observed at concentrations of carbon-containing species less than about 0.15 mole percent in $CH_4$ with near term projected rates of greater than 10 micrometers per hour over large areas for optimized conditions. Resistively or inductively heated graphite heat exchangers are proposed to generate thermally dissociated chlorine.

An object of the present invention is to provide a CVD process which allows generation of atomic hydrogen and thus chemical vapor deposition of diamond at somewhat higher gas activation temperatures than those of U.S. Pat. Nos. 5,071,677 and 5,316,795 but still below those of prior art high energy level processes. This is accomplished by first generating a stream of atomic halogen gas, preferably atomic chlorine, by thermally dissociating relatively weak molecular chlorine in a heated graphite heat exchanger at temperatures less than about 1,800° C. and subsequently mixing the atomic chlorine with molecular hydrogen downstream at a point in close proximity (preferably about 1 to 50 millimeters) to the substrate upon which diamond is to be deposited. Atomic hydrogen is then produced by the rapid chemical reaction of atomic chlorine with molecular hydrogen, i.e., $Cl+H2 \leftrightharpoons H+HCl$.

Due to the fact that the Cl—Cl bond is much weaker than the H—H bond (243 vs. 436 kJ/mol), atomic chlorine is much more easily generated than atomic hydrogen by thermal dissociation from their respective precursors. This is readily seen from FIG. 1 which shows that at 17 Torr 85% dissociation of $Cl_2$ is achieved at 1,500° C. while 2,900° C. is required for similar dissociation of $H_2$. At 5 Torr, the percentage of dissociation of $Cl_2$ and $H_2$ is increased to 95% at the respective temperatures. In practicing the invention, temperature and pressure ranges are selected so as to produce a minimum dissociation of at least about 20 mole percent, and preferably about 80 mole percent or more of the molecular chlorine.

Graphite is an excellent container for chlorine dissociation since graphite is thermodynamically inert to chlorine because $CCl_4$ completely decomposes to graphite and atomic chlorine at these temperatures.

A simple compact CVD reactor containing a graphite heat exchanger was built, which allows for separate introduction of chlorine, hydrogen and carbon-containing species with subsequent mixing of the heated gases. Atomic chlorine is generated prior to its mixing with molecular hydrogen and carbon-containing species. Resistively or inductively heated graphite heat exchangers are proposed to generate thermally dissociated chlorine.

Diamond deposits on pre-treated platinum substrates were obtained over a variety of substrate temperatures and $H_2/Cl_2$ mole ratios. Best quality diamond is produced at substrate temperatures less than 950° C. with significant diamond depositions observed at temperatures down to 100° C. Parameters controlling the quality of diamond deposits were investigated with the quality of the diamond deposition characterized by Raman spectroscopy. The all-carbon nature of the heat exchanger and the lower activation temperatures involved in the present invention favor the formation of diamond deposits free of metals and nitrogen.

Diamond growth rates of about 4 micrometers per hour have been observed at the concentrations of carbon-containing species less than 0.15 mole percent in $CH_4$ with anticipated rates of greater than 10 micrometers per hour over large areas. A similar procedure is possible with elemental fluorine produced by dissociation of fluorine gas, but is of less commercial interest because of the higher cost of using fluorine as a feedstock.

DESCRIPTION OF THE PREFERRED EMBODIMENTS

Figure 1:
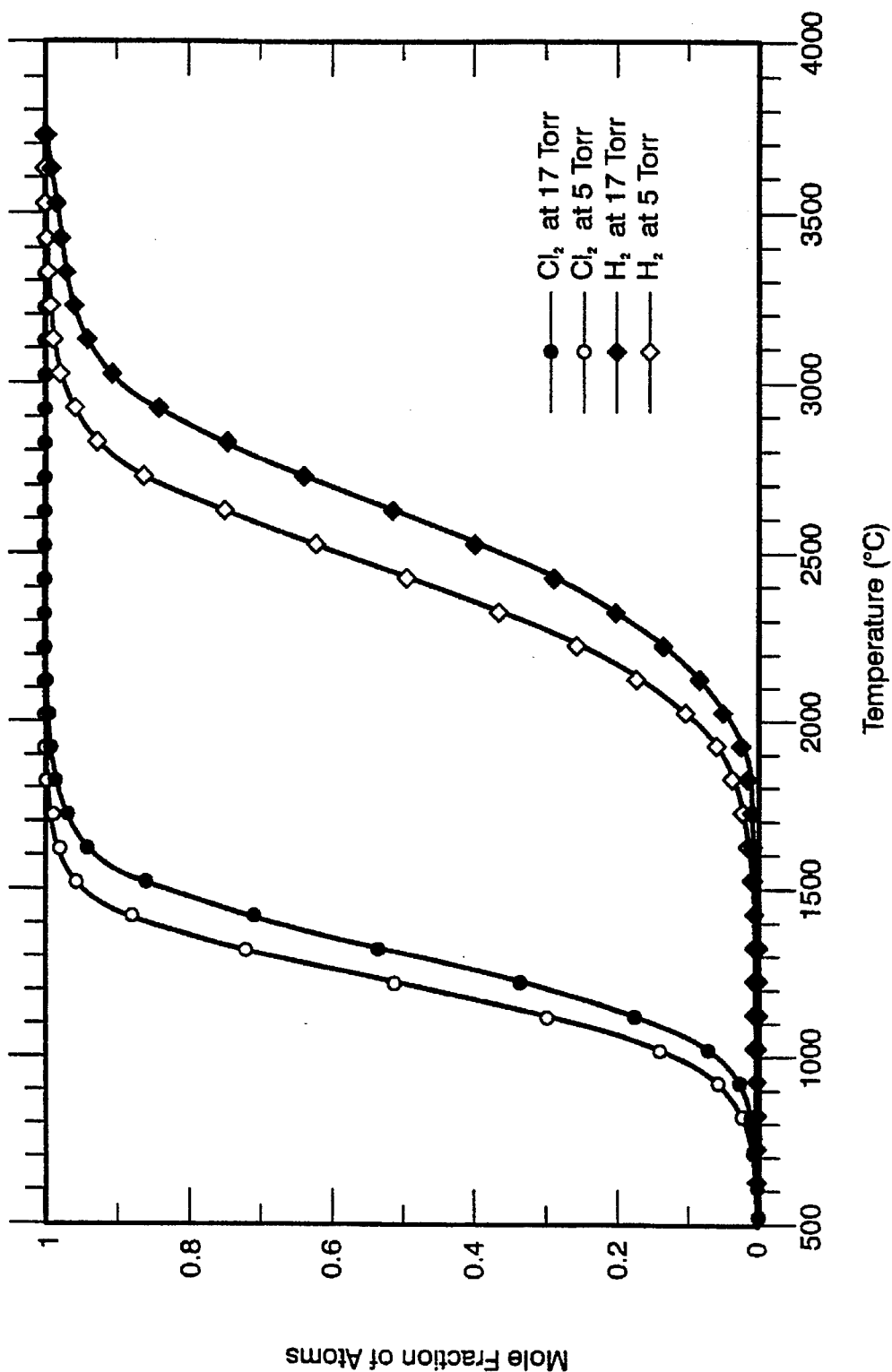
FIG. 1 is a graphic representation of equilibrium calculations of the dissociation of molecular chlorine and hydrogen at pressures of 5 and 17 Torr.

The present invention is the first known method for producing diamond films and particles at substrate temperatures of 100° C.–950° C. by first generating a separate stream of atomic halogen, preferably chlorine or fluorine, and subsequent generation of atomic hydrogen and the active carbon species by downstream mixing of the atomic chlorine with molecular hydrogen and carbon-containing species. Atomic chlorine is generated from the thermal dissociation of molecular chlorine in a heated graphite heat exchanger at temperatures of from about 1,100° C. to about 1,800° C. under low pressures (<100 Torr). Previous CVD diamond growing systems have employed direct generation of atomic hydrogen from the dissociation of molecular hydrogen at high energy level activation temperatures of more than 2,000° C., and most prior art methods require substrate temperatures in excess of about 700° C.

In the present invention, molecular chlorine preferably is used to generate atomic hydrogen and the active carbon species by first separate generation of atomic chlorine by the thermal dissociation of molecular chlorine in a heated graphite heat exchanger at temperatures of 1,100° C.–1,800° C. and subsequent downstream mixing of the atomic chlorine with molecular hydrogen and the carbon-containing species.

The heating of the graphite heat exchanger for the thermal dissociation of molecular chlorine is preferably achieved by resistive heating. Molecular chlorine may also be dissociated to the atomic state by inductive heating, photolysis and electrical discharges prior to mixing with molecular hydrogen and the carbon-containing species. Molecular fluorine may also be used in a similar procedure to generate atomic hydrogen and the active carbon species, where a diamond tube heat exchanger heated to temperatures of 500° C. to 1,800° C. may be used to achieve the thermal dissociation of molecular fluorine.

In the present invention, molecular hydrogen is typically used in supplying hydrogen atoms in the process, although other hydrogen-containing species may be used.

The carbon-containing species in the process of the present invention include the simple alkanes such as methane and ethane, unsaturated hydrocarbons such as ethylene and acetylene and halogenated hydrocarbons such as trifluoromethane, as well as others.

Molecular hydrogen and the carbon-containing species are typically mixed prior to their introduction into the reaction chamber. Alternatively, they may be supplied as separate streams. The quality of diamond deposits has been found to vary with the substrate temperatures and with the relative mole ratios of hydrogen, chlorine and carbon species. Best quality diamond deposits have been achieved on substrate temperatures less than 950° C. with significant diamond depositions observed at temperatures down to 100° C., with the initial mole concentrations of the gases in the decreasing order of molecular hydrogen, molecular chlorine and the carbon-containing species. The carbon concentration is typically less than 1 mole percent of the hydrogen content.

In our experimental apparatus described below, flow rates of molecular hydrogen typically range from about 500 standard cubic centimeter per minute (sccm) to 5 liters per minute (slm). Flow rates of molecular chlorine preferably range from about 10 sccm to about 500 sccm. The carbon-containing species, for instance methane, is preferably supplied at a rate of from about 0.5 sccm to about 10 sccm. The preferred ratio of molecular hydrogen to molecular carbon-containing species supplied to the reactor in the process ranges from about 10,000 to 1 to about 50 to 1, with, most preferably, at least about 100 moles or more of hydrogen gas being supplied for each mole of carbon-containing species. The preferred range of ratios of molecular hydrogen to molecular chlorine supplied to the reactor is from about 500 to 1 to about 1 to 1.

Diamond films and particles are produced in the present invention by heating molecular chlorine in the heated graphite heat exchanger to temperatures of about 1,100° C.–1,800° C., and by introducing separately the mixture of molecular hydrogen and carbon-containing species to the reaction chamber, and by subsequently mixing the reactant gases downstream and flowing the gases over a growth substrate. The radiation from the heated graphite heat exchanger may be used to preheat the molecular hydrogen and the carbon-containing species to a temperature of from about 50° C. to about 150° C. less than the temperature of the chlorine gas inside the heat exchanger. The temperature of the growth substrate may be controlled by the balance of resistive heating of the substrate, radiation heating from the heat exchanger and cooling, such cooling being optionally provided, by flowing high velocity gases such as molecular hydrogen onto the back of the growth substrate. The growth substrate may be of any material such as platinum, molybdenum, tungsten, silicon nitride, Teflon which can withstand the chlorine-containing environment and temperatures in the 950° C. to 100° C. range. For metals which do not withstand the chlorine-containing environment, protective layers such as metal nitrides and oxides may be used to protect the growth substrates. The growth substrate preferably is prepared by conventional methods of diamond seeding such as sonicating the substrate in suspension fluid containing fine diamond grit (typically <10 micrometers in diameter) or rubbing the substrate with the diamond grit, followed by removal of any remaining grit prior to insertion of the substrate into the reactor. Alternatively, untreated substrate may be used.

The rate of diamond formation has been found to increase with the increase of the concentrations of the carbon-containing species and molecular chlorine and with the increase of the substrate and dissociation temperatures. Because the dissociation of molecular chlorine is lessened when the gas pressure inside the dissociation regime is increased, a higher dissociation temperature is required to achieve a similar degree of the chlorine dissociation, preferably at least 20 mole percent, and more preferably about 80 mole percent or more of the molecular chlorine flowing through the graphite heat exchanger. Therefore, the maximum rate of diamond formation depends on both the dissociation temperature and pressure. Enhanced diamond growth rates are achieved when the velocities of the gas flows are increased, but excessive high flows of the gases will lead to decreased diamond growth rates.

The diamond films and particles prepared in accordance with the present invention have been analyzed by the use of Raman spectroscopy. Diamond has a distinctive sharp Raman line at 1,332 cm$^{-1}$. Graphite (which is approximately a fifty-times better Raman scatter than is diamond) has two intense and broad Raman peaks at approximately 1,360 and 1,580 cm$^{-1}$. FIG. 3 illustrates a Raman spectrum of a diamond film prepared in accordance with the present invention showing the appearance of the diamond peak at approximately 1,332 cm$^{-1}$ with no indication of bands due to graphite being present.

Figure 2:
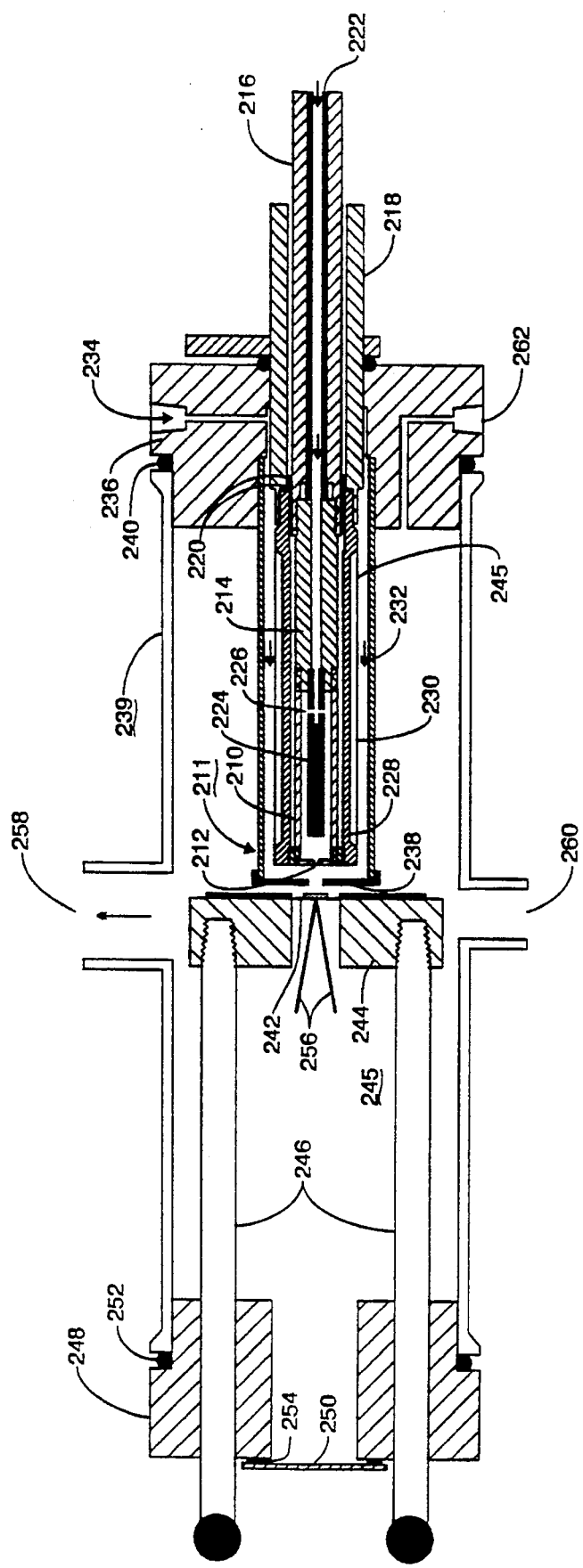
FIG. 2 is a schematic illustration of a chlorine-activated diamond CVD reactor in accordance with the present invention.

The CVD diamond formation process in accordance with the present invention may be carried out in a wide range of apparatus. FIG. 2 is a simplified illustration of one such apparatus similar to that used in laboratory experiments discussed below in connection with the invention.

The chlorine-activated CVD (CA-CVD) reactor shown in FIG. 2 is 12 inches long and 4.5 inches in diameter. As shown in FIG. 2, it consists of a water-cooled coaxial graphite furnace 211, sample holder/substrate 245 and double-wall glass chamber 239. The low pressure of the system is provided by a rotary pump and Roots blower combination (not shown) in which a fluorocarbon pump fluid is used to handle chlorine-containing gases. The combined pumping system is capable of pumping at 180 CFM. the connections between the pump and the reactor are made with 1 inch and 2 inch diameter PVC tubing. A trap containing sodium hydroxide solution is installed at the pump exhaust to remove HCl and $Cl_2$.

The graphite furnace 211, a key component of the CA-CVD reactor, has been designed and constructed to generate an atomic chlorine flux. Because of its excellent resistance to a chlorine environment, especially at elevated temperatures, high density graphite has been used in the construction of the graphite furnace. The heated cell of the furnace 210 is a tube with a ⅜ inch outer diameter and 1/32 inch wall thickness and 2 ⅜ inch in length. The chlorine exits from a 1/16 inch center hole 212 into a reaction chamber. The heated cell fits snugly over another graphite tube 214 which is screwed into a water-cooled copper electrode 216. The cooling water is sealed between the inner copper electrode 216 and an outer copper electrode 218 by an o-ring 220 at their interface. A 3/16 inch Teflon tube 222 runs from the graphite tube 214 through the inner copper electrode 216. Molecular chlorine is introduced into the heated graphite cell 210 through the Teflon tube 222. The Teflon tube 222 prevents direct contact with and hence corrosion of the inner copper electrode 216 by the $Cl_2$ gas. Inside the heated graphite cell 210, there is a 5/32 inch diameter graphite rod insert 224 which provides additional surface heating of the $Cl_2$ as it flows through the cell. At the upstream end of the graphite rod 224, four holes 226 act as $Cl_2$ inlets so that $Cl_2$ gas entering the cell 210 is directed toward a hot wall of the cell 210 before flowing along the space between the wall of the cell 210 and the center rod 224. Temperatures measured by an optical pyrometer sited on the front face of the heated cell 210 and the graphite rod 224 were found to be same. The radiation shield is furnished with three concentric thin wall graphite tubes 284 and 230 and 232. The inner most tube 28, which is connected to the outer copper electrode 218, also functions as an electrical current return route for the heated graphite cell 210. Mixtures of $H_2$ and carbon species such as $CH_4$ are introduced from a port 234 on a Teflon plug 236 and flow downstream in the space between the outer 232 and the two inner graphite radiation shields 284 and 230 and are forced by a graphite cap 238, which fits over the outer radiation shield 232, to turn toward the center of the furnace 211 where they mix with the atomic chlorine gas exiting the heated cell orifice 212. The opening of the graphite cap 238 is ⅛ inch in diameter. The entire furnace assembly is mounted on the Teflon plug 236 which fits into the 3 inch inner diameter of the double-wall water-cooled glass chamber 239. The vacuum seal between the Teflon plug 236 and the glass chamber 239 is provided by an o-ring 240 which fits on the Teflon plug 236.

A platinum substrate 242 is mounted in the reaction chamber about 5 mm away from the graphite cap 238 on graphite electrodes 244 which are connected to a pair of water-cooled copper leads 246. The Cu leads 246 are wrapped with a heat shrinkable tubing to prevent corrosion from chlorine species. They are fixed on a Teflon flange 248 which also contains a 1 inch diameter centered window 250 for in situ growth studies with a Fizeau fringe monitor. The vacuum seal between the glass chamber 239 and the Teflon flange 248 is provided by an o-ring 252 which fits on the Teflon flange 248, and the vacuum seal between the Teflon flange 248 and the window 250 is provided by an o-ring 254. The graphite electrodes 244 allow the substrate to be heated to the desired temperatures. The substrate temperature is measured by a Pt vs. Pt-13% Rh thermocouple 254 spot welded to the middle of the Pt substrate 252.

A dynamic pumping is provided to the reactor through a port 256 on the glass chamber 239. A vacuum gauge is connected to a port 258 on the chamber 239 to provide pressure readings. If needed, the reactor can be vented by back filling with dry inert gases through a port 260 on the Teflon plug 236.

EXAMPLES

The following examples are provided to illustrate the present invention and are not intended for the purposes of limitation. The processes reflected in the Examples 1 to 8 were conducted in a laboratory apparatus such as that illustrated in FIG. 2. The processes reflected in the Examples 1 and 2 were conducted on pretreated platinum substrates. The processes reflected in the Examples 3 to 8 were conducted on polished diamond (110) substrates where homoepitaxial diamond growth rates were determined by an in situ Fizeau optical interferometer. The processes reflected in Example 9 were conducted in a laboratory apparatus as described in the Example 9.

Example 1

66.6 sccm Cl2 mixed with 40 sccm Ar was introduced into the graphite cell resistively heated at about 1,300° C. while 2,000 sccm H2 mixed with 1.0 sccm CH4 was introduced separately into the reactor through the space between the radiation shields. The pressure in the reactor was 17 Torr. Platinum substrates were pretreated with a gentle <1 micrometer diamond grit sonicating followed by removal of all excess grit prior to placement in the reactor for deposition. Four deposition runs were performed, with the substrate temperature being varied from 550° C. to 850° C. in increments of 100° C. Each deposition run was conducted for 2 hours. Diamond films were obtained in all runs. The Raman spectra of the diamond films gave a single sharp peak centered at about 1,332 $cm^{-1}$ indicating pure diamond in the films. The diamond quality for substrate temperatures from 550° C. to 850° C. appears similar but an underlying fluorescence is seen to decrease as the substrate temperature increases. It is felt that the fluorescence results from the substrate.

Example 2

1,140 sccm H2 mixed with 1.0 sccm CH4 was introduced into the reactor through the space between the radiation shields. Two deposition runs were performed with, respectively, 20 sccm Cl2 mixed with 19 sccm Ar and 38 sccm Cl2 mixed with 19 sccm Ar were introduced into the graphite cell resistively heated at about 1,300° C. The pressure in the reactor was about 17 Torr. Platinum substrates were pretreated with a gentle <1 micrometer diamond grit sonicating followed by removal of all excess grit prior to placement in the reactor for deposition. The substrate temperature was 700° C. for the run where 20 sccm Cl2 was used and 755° C. for the run where 38 sccm Cl2 was used. Diamond films were grown on the platinum substrates from both runs. Raman spectra of the diamond films revealed a single sharp peak centered at about 1,332 $cm^{-1}$ indicating pure diamond in the films.

Example 3

1,500 sccm H2 mixed with a variation of CH4 flow was introduced into the reactor through the space between the radiation shields while 30 sccm Cl2 mixed with 40 sccm Ar was introduced into the graphite cell resistively heated to about 1,300° C. The deposition was directed on a polished (110) diamond chip of Type IA which was firmly mounted by two spot welded platinum pieces in the center of a platinum strip with a 1 mm hole. The temperature of the diamond substrate was measured by a Pt vs. Pt-13% Rh thermocouple spot welded adjacent to the diamond substrate on the platinum strip. The temperature of the diamond substrate was 800° C. and the pressure in the reactor was 17 Torr. The temperature of the diamond substrate was maintained to better than ±1°. Diamond was grown homoepitaxially on the diamond substrate. A Fizeau optical interferometer was used in situ monitoring the diamond growth process by illuminating the back of the diamond substrate through the 1 mm hole on the platinum strip. The diamond growth rate was determined later from the relative movements of interference fringes. The diamond growth rate was found to increase approximately linearly from 0.25 micrometers per hour to 0.42 micrometers per hour when the CH4 flow rate was increased from 1.0 sccm to 2.00 sccm.

Example 4

1,500 sccm H2 mixed with 2.0 sccm CH4 was introduced into the reactor through the space between the radiation shields while a variation of Cl2 flow mixed with 40 sccm Ar was introduced into the graphite cell resistively heated at about 1,300° C. The deposition was directed on a polished (110) diamond chip of Type IA which was firmly mounted by two spot welded platinum pieces in the center of a platinum strip with a 1 mm hole. The temperature of the diamond substrate was measured by a Pt vs. Pt-13% Rh thermocouple spot welded adjacent to the diamond substrate on the platinum strip. The temperature of the diamond substrate was 800° C. and the pressure in the reactor was 20 Torr. The temperature of the diamond substrate was maintained to better than ±1°. Diamond was grown homoepitaxially on the diamond substrate. The diamond growth rates were determined by an in situ Fizeau optical interferometer. The diamond growth rate was found to increase from 0.26 micrometers per hour at 15 sccm Cl2 flow to 2.7 micrometers per hour at 100 sccm Cl2 flow.

Example 5

1,500 sccm H2 mixed with 1.0 sccm CH4 was introduced into the reactor through the space between the radiation shields while 50 sccm Cl2 flow mixed with 40 sccm Ar was introduced into the graphite cell resistively heated at about 1,500° C. The pressure in the reactor was 20 Torr. The deposition was directed on a polished (110) diamond chip of Type IA which was firmly mounted by two spot welded platinum pieces in the center of a platinum strip with a 1 mm hole. The temperature of the diamond substrate was measured by a Pt vs. Pt-13% Rh thermocouple spot welded adjacent to the diamond substrate on the platinum strip. A series of runs were performed when the temperature of the diamond substrate was varied from 102° C. to 950° C. The temperature of the diamond substrate of each run was maintained constant during each test run at the test set point to better than ±1°. Diamond was grown homoepitaxially on the diamond substrate at each substrate temperature tested. The diamond growth rates were determined by an in situ Fizeau optical interferometer. The diamond growth rate was found to be 2.3 micrometers per hour at the substrate temperature of 950° C. and about 0.2 micrometers per hour at the substrate temperature of 102° C.

Example 6

1,500 sccm H2 mixed with 2.0 sccm CH4 was introduced into the reactor through the space between the radiation shields while 50 sccm CL2 flow mixed with 40 sccm Ar was introduced into the graphite cell resistively heated at various test temperatures of from 1,200° C. to 1,680° C., but maintained constant for each test. The deposition was directed on a polished (110) diamond chip of Type IA which was firmly mounted by two spot welded platinum pieces in the center of a platinum strip with a 1 mm hole. The temperature of the diamond substrate was measured by a Pt v. Pt-13% Rh thermocouple spot welded adjacent to the diamond substrate on the platinum strip. The temperature of the diamond substrate was 700° C. and the pressure in the reactor was 20 Torr. The temperature of the diamond substrate was maintained to better than ±1°. Diamond was grown homoepitaxially on the diamond substrate. The diamond growth rates were determined by an in situ Fizeau optical interferometer. The diamond growth rate was found to increase approximately linearly from 0.47 micrometers per hour when the graphite cell was resistively heated at about 1,200° C. to 2.8 micrometers per hour when the graphite cell was heated at about 1,680° C.

Example 7

1,500 parts of H2 mixed with 1 part of CH4 was introduced into the reactor through the space between the radiation shields while 50 parts of Cl2 flow was introduced into the graphite cell resistively heated at about 1,750° C. The flow of H2 was varied from 500 sccm to 4,000 sccm at the same time proportionally increasing the flows of CH4 and CL2 in order to increase the gas flow velocities without diluting the concentrations of the gases. The deposition was directed on a polished (110) diamond chip of Type IA which was firmly mounted by two spot welded platinum pieces in the center of a platinum strip with a 1 mm hole. The temperature of the diamond substrate was measured by a Pt v. Pt-13% Rh thermocouple spot welded adjacent to the diamond substrate on the platinum strip. The temperature of the diamond substrate was 850° C. and the pressure in the reactor was 20 Torr. The temperature of the diamond substrate was maintained to better than ±1°. Diamond was grown homoepitaxially on the diamond substrate. The diamond growth rates were determined by an in situ Fizeau optical interferometer. The diamond growth rate was found to reach a maximum of about 4.0 micrometers per hour when the flows of H2, CH4 and Cl2 were 2,000 sccm, 1.33 sccm and 66.6 sccm, respectively.

Example 8

1,000 sccm H2 mixed with 0.67 sccm CH4 was introduced into the reactor through the space between the radiation shields while 33.3 sccm Cl2 flow mixed with 40 sccm Ar was introduced into the graphite cell resistively heated at about 1,550° C. The deposition was directed on a polished (110) diamond chip of Type IA which was firmly mounted by two spot welded platinum pieces in the center of a platinum strip with a 1 mm hole. The temperature of the diamond substrate was measured by a Pt vs. Pt-13% Rh thermocouple spot welded adjacent to the diamond substrate on the platinum strip. The temperature of the diamond substrate was 900° C. The temperature of the diamond substrate was maintained to better than ±1°. The pressure in the reactor was varied in the range of 5 Torr to 100 Torr. Diamond was grown homoepitaxially on the diamond substrate. The diamond growth rates were determined by an in situ Fizeau optical interferometer. The diamond growth rate was found to reach a maximum of about 1.4 micrometers per hour when the pressure in the reactor was kept at about 25 Torr.

Example 9

The dissociation of molecular chlorine and the generation of atomic chlorine were achieved in two heated parallel graphite tubes where molecular chlorine was fed from the two ends of the graphite tubes. The graphite tubes were resistively heated at about 1,550° C. The outside diameter of the graphite tubes was 3/16 inch and the inside diameter was 1/8 inch and the radiation length was 1¼ inch. The activated chlorine gas exit the graphite tubes through an array of gas outlet nozzles along the tubes. H2 and CH4 mixtures were supplied from an array of holes with 1/80 inch in diameter of a graphite block. The holes for H2 and CH4 supplies were aligned with the holes of the heated graphite tubes where molecular chlorine was dissociated. Atomic chlorine was mixed with molecular hydrogen and methane when atomic chlorine exited the gas outlet nozzles of the two heated parallel graphite tubes. Platinum, tungsten, molybdenum, and silicon nitride substrates were pretreated with a gentle <1 micrometer diamond grit sonicating followed by removal of all excess grit prior to placement in the reactor for deposition. The substrates were placed about 5 mm away from the array of holes of the two heated graphite tubes. The substrate temperature was held at about 700° C. Diamond films and particles were grown on all said substrates at separate supplies of 1,500 sccm H2 mixed with 1.0 sccm CH4 and 150 sccm Cl2 mixed with 40 sccm Ar. The diamond films and particles gave a single sharp Raman peak center at 1,332 $cm^{-1}$ indicating pure diamond in the films and particles.

The foregoing disclosure and description of the invention is illustrative and explanatory only and various changes may be made in the details of the method and apparatus disclosed without departing from the scope of the invention, which is measured by the appended claims.

What is claimed is:

1. A method of depositing diamond on a substrate, said method comprising:

providing a first gas stream comprising molecular halogen, said first gas stream being substantially free of hydrogen-containing species;

treating said first gas stream so as to dissociate at least a portion of said molecular halogen into atomic halogen;

admixing with said first treated gas stream hydrogen gas and a carbon-containing species, which hydrogen gas and carbon-containing species have not been pretreated for activation to a high energy level, to provide a gas stream mixture;

flowing said gas stream mixture over the substrate so as to deposit diamond on at least a portion of said substrate.

2. The method according to claim 1 wherein said step of treating said first gas stream to dissociate at least a portion of said halogen molecules into atomic halogen comprises heating said first gas stream to a temperature of from about 1,100° C. to about 1,800° C. so as to dissociate at least a portion of said molecular halogen into atomic halogen.

3. The method according to claim 2 wherein said step of treating said first gas stream comprises photolysis of said first gas stream so as to dissociate at least a portion of said halogen in said first gas stream into atomic halogen.

4. The method according to claim 1 wherein said method of treating said first gas stream comprises exposing said first gas stream to electrical discharges.

5. The method according to claim 1 wherein said step of treating said first gas stream results in the dissociation of at least approximately 20 mole percent of the molecular halogen in said first gas stream into atomic halogen.

6. The method according to claim 2 wherein said substrate is heated to a temperature of from about 100° C. to about 950° C.

7. The method according to claim 1 wherein said admixing step to produce said gas stream mixture occurs at a location not more than about 50 mm upstream from said substrate.

8. The method according to claim 1 wherein said first gas stream is substantially free of both hydrogen and carbon-containing species.

9. A method of depositing diamond on a substrate, said method comprising:

positioning the substrate onto which diamond is to be deposited in a reaction chamber;

supplying to said reaction chamber a first gas stream comprising chlorine in which at least approximately 20 mole percent of said chlorine is dissociated into atomic chlorine, said first gas stream being substantially free of hydrogen-containing species;

supplying a hydrogen-containing species which has not been pretreated for activation to a high energy level, and a carbon-containing species which has not been pretreated for activation to a high energy level to said reaction chamber;

admixing said hydrogen-containing species, carbon-containing species and atomic chlorine from said first gas stream in said reaction chamber to provide a gas mixture; and flowing said gas mixture over said substrate, so as to deposit diamond on at least a portion of said substrate.

10. The method according to claim 9 wherein said admixing step to provide said gas mixture occurs at a location not more than about 50 mm upstream from said substrate.

11. The method according to claim 9 wherein said first gas stream is substantially free of both hydrogen and carbon-containing species.

12. A method of depositing diamond on a substrate, said method comprising:

heating a first gas stream comprising molecular chlorine in a graphite heat exchanger to a temperature of from about 1,100° C. to about 1,800° C. so as to dissociate at least a portion of said molecular chlorine into atomic chlorine, said first gas stream being substantially free of hydrogen-containing species;

admixing said atomic chlorine with hydrogen gas which has not been pretreated for activation to a high energy level and with a gaseous carbon-containing species which has not been pretreated for activation to a high energy level, so as to provide a gas mixture; and flowing said gas mixture over the substrate so as to deposit diamond on at least a portion of said substrate.

13. The method according to claim 12 wherein said admixing step to provide said gas mixture takes place at a location not more than about 50 mm upstream from said substrate.

14. A method of depositing diamond on a substrate, said method comprising:

supplying atomic chlorine to a reaction vessel containing the substrate;

supplying hydrogen which has not been pretreated for activation to a high energy level and a carbon-containing species which has not been pretreated for activation to a high energy level to said reaction vessel separately from said atomic chlorine;

admixing said atomic chlorine, hydrogen and carbon-containing species in said reaction vessel to provide a gas mixture; and flowing said gas mixture over said substrate so as to deposit diamond on at least a portion of said substrate.

15. The method according to claim 14 wherein said atomic chlorine is generated by heating a gas stream comprising molecular chlorine to a temperature of from about 1,100° C. to about 1,800° C. so as to dissociate at least a portion of said molecular chlorine into atomic chlorine.

16. The method according to claim 14 wherein said substrate is heated to a temperature of from about 100° C. to about 950° C.

17. The method according to claim 14 wherein said hydrogen comprises molecular hydrogen.

18. The method according to claim 14 wherein said carbon-containing species selected from the group consisting of saturated hydrocarbons, unsaturated hydrocarbons and halogenated hydrocarbons.

19. The method according to claim 14 wherein said carbon-containing species is selected from the group consisting of methane, ethane, ethylene, acetylene and trifluoromethane.

20. The method according to claim 14 wherein said hydrogen and said carbon-containing species are premixed prior to admixture with said atomic chlorine in said reaction vessel.

21. The method according to claim 14 wherein said hydrogen and said carbon-containing species are heated to a temperature of from about 1,050° C. to about 1,750° C. prior to admixture with said atomic chlorine.

22. The method according to claim 15 wherein said chlorine-containing gas stream is heated in a graphite heat exchanger.

23. The method according to claim 14 wherein said gas mixture is formed in close proximity to said substrate.

24. The method according to claim 14 wherein at least approximately 100 moles or more of hydrogen gas are supplied to said reactor for each mole of carbon-containing species supplied to said reactor.

25. The method according to claim 14 wherein the ratio of molecular hydrogen to molecular carbon-containing species is in the range of from about 10,000 to1 to about 50 to 1.

26. The method according to claim 14 wherein the ratio of molecular hydrogen to molecular chlorine supplied to said reactor is in the range of from about 500 to 1 to about 1 to 1.

27. The method according to claim 14 wherein said admixing step to provide said gas mixture takes place at a location not more than about 50 mm upstream from said substrate.

28. The method according to claim 14 wherein said first gas stream is substantially free of both hydrogen and carbon-containing species.

29. A method of depositing diamond on a substrate comprising:

generating a first gas stream comprising an atomic halogen species by dissociating a molecular halogen species, said first gas stream being substantially free of hydrogen-containing species;

supplying said first gas stream to the reaction chamber of a reaction vessel;

supplying a hydrogen-containing species which has not been pretreated for activation to a high energy level and a carbon-containing species which has not been pretreated for activation to a high energy level to said reaction chamber of said reactor vessel separately from said first gas stream;

admixing said hydrogen-containing species, carbon-containing species and atomic hydrogen species in said reaction chamber to provide a gas mixture;

flowing said gas mixture over the substrate in said reaction chamber so as to deposit diamond on at least a portion of said substrate.

30. The method according to claim 29 wherein said halogen-containing species comprises molecular chlorine.

31. The method according to claim 29 wherein said halogen-containing species comprises molecular fluorine.

32. The method according to claim 29 wherein said halogen-containing species in said first gas stream is dissociated into atomic halogen by thermal decomposition at a temperature of from about 500° C. to about 1,800° C.

33. The method according to claim 29 wherein said halogen-containing species is dissociated into atomic halogen by photolysis of said first gas stream.

34. The method according to claim 29 wherein said halogen-containing species is dissociated into atomic halogen by exposing said halogen-containing species in said first gas stream to electrical discharges.

35. The method according to claim 29 wherein said admixing step to provide said gas mixture takes place at a location not more than about 50 mm upstream from said substrate.

36. The method according to claim 29 wherein said first gas stream is substantially free of both hydrogen and carbon-containing species.

* * * * *